(12) United States Patent
Nakajima et al.

(10) Patent No.: US 11,628,534 B2
(45) Date of Patent: Apr. 18, 2023

(54) SILICON WAFER SINGLE-SIDE POLISHING METHOD

(71) Applicant: SUMCO CORPORATION, Tokyo (JP)

(72) Inventors: Toshiharu Nakajima, Tokyo (JP); Kazuaki Kozasa, Tokyo (JP); Katsuhisa Sugimori, Tokyo (JP); Syunya Kobuchi, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 998 days.

(21) Appl. No.: 16/069,300

(22) PCT Filed: Dec. 2, 2016

(86) PCT No.: PCT/JP2016/085929
§ 371 (c)(1),
(2) Date: Jul. 11, 2018

(87) PCT Pub. No.: WO2017/134919
PCT Pub. Date: Aug. 10, 2017

(65) Prior Publication Data
US 2019/0030676 A1 Jan. 31, 2019

(30) Foreign Application Priority Data
Feb. 3, 2016 (JP) .............................. JP2016-018759

(51) Int. Cl.
*B24B 37/10* (2012.01)
*H01L 21/306* (2006.01)
(Continued)

(52) U.S. Cl.
CPC .......... *B24B 37/107* (2013.01); *B24B 37/042* (2013.01); *B24B 37/10* (2013.01);
(Continued)

(58) Field of Classification Search
CPC ..... B24B 37/107; B24B 37/10; B24B 37/105; B24B 51/00; B24B 37/042; B24B 49/12;
(Continued)

(56) References Cited

U.S. PATENT DOCUMENTS 6,343,978 B1 * 2/2002 Shimizu .................... B08B 1/04
451/287
6,790,768 B2 * 9/2004 Moon ................. H01L 21/3212
438/692
(Continued)

FOREIGN PATENT DOCUMENTS

AU 2008308583 A1 * 4/2009 ........... C09K 3/1463
CN 101417407 B * 10/2011
(Continued)

OTHER PUBLICATIONS

Korean Office Action in related Korean Application No. 10-2018-7016000, dated Oct. 8, 2019, and English-language translation thereof.
(Continued)

*Primary Examiner* — Joel D Crandall
*Assistant Examiner* — Arman Milanian
(74) *Attorney, Agent, or Firm* — Greenblum & Bernstein, P.L.C.

(57) ABSTRACT

A silicon wafer single-side polishing method that can significantly improve the stepped minute defect occurrence rate is provided. The silicon wafer single-side polishing method comprises: a first polishing step of performing polishing on one side of a silicon wafer under a first polishing condition; and a second polishing step of performing polishing on the silicon wafer under a second polishing condition in which at least one of an applied pressure and a relative speed in the first polishing condition is changed, after the first polishing step, wherein a polishing rate ratio according to the first
(Continued)

polishing condition is higher than a polishing rate ratio according to the second polishing condition.

4 Claims, 7 Drawing Sheets

(51) Int. Cl.
    *H01L 21/3105*     (2006.01)
    *B24B 51/00*     (2006.01)
    *B24B 37/04*     (2012.01)
    *H01L 21/02*     (2006.01)
    *B24B 37/005*     (2012.01)

(52) U.S. Cl.
    CPC .......... *B24B 37/105* (2013.01); *B24B 51/00* (2013.01); *H01L 21/02024* (2013.01); *H01L 21/30625* (2013.01); *H01L 21/31053* (2013.01); *B24B 37/0053* (2013.01)

(58) Field of Classification Search
    CPC . B24B 49/16; B24B 37/005; H01L 21/02024; H01L 21/30625; H01L 21/31053; H01L 21/304; H01L 21/31051; H01L 21/32115; H01L 21/02013
    USPC .................................................. 451/5, 8, 42
    See application file for complete search history.

(56) References Cited

U.S. PATENT DOCUMENTS

| | | | |
|---|---|---|---|
| 7,621,799 B2* | 11/2009 | Sakairi | H01L 21/02024 451/36 |
| 9,956,663 B2 | 5/2018 | Kozasa et al. | |
| 9,991,110 B2 | 6/2018 | Kozasa et al. | |
| 10,391,607 B2* | 8/2019 | Kawasaki | H01L 21/02013 |
| 2002/0002029 A1* | 1/2002 | Kimura | B24B 37/042 451/41 |
| 2002/0016073 A1* | 2/2002 | Kondo | H01L 21/3212 438/691 |
| 2005/0142991 A1* | 6/2005 | Nakao | B24B 49/12 451/64 |
| 2005/0176253 A1* | 8/2005 | Shigeta | H01L 21/7684 438/692 |
| 2005/0215180 A1* | 9/2005 | Idani | H01L 21/31053 451/36 |
| 2011/0151751 A1* | 6/2011 | Korogi | B24B 37/042 451/28 |
| 2012/0135668 A1* | 5/2012 | Nakanishi | B24B 9/065 451/28 |
| 2012/0156878 A1 | 6/2012 | Ogata et al. | |
| 2017/0210958 A1* | 7/2017 | Shinoda | C09K 3/1463 |

FOREIGN PATENT DOCUMENTS

| | | |
|---|---|---|
| JP | H10-242090 A | 9/1998 |
| JP | 2008-91594 A | 4/2008 |
| JP | 2011-42536 A | 3/2011 |
| JP | 2011042536 A * | 3/2011 |

OTHER PUBLICATIONS

International Search Report issued in WIPO Patent Application No. PCT/JP2016/085929, dated Jan. 10, 2017.
International Preliminary Report on Patentability for PCT/JP2016/085929, dated Aug. 7, 2018, with English language translation.

* cited by examiner

SILICON WAFER SINGLE-SIDE POLISHING METHOD

TECHNICAL FIELD

The present disclosure relates to a silicon wafer single-side polishing method.

BACKGROUND

Methods of polishing surfaces of semiconductor wafers required to be highly flat, such as silicon wafers, are broadly classified into two types: a double-side polishing method of simultaneously polishing both sides of a semiconductor wafer; and a single-side polishing method of polishing only one side thereof. Single-side polishing methods are used in a wide variety of applications from lapping using a relatively stiff polishing cloth to final polishing using a relatively soft polishing cloth.

A typical single-side polishing method using a conventional single-side polishing apparatus 100 is described below, with reference to FIG. 1. The single-side polishing apparatus 100 has a polishing head 120 holding a semiconductor wafer W, and a rotatable platen 140 to which a polishing cloth 130 is attached. The single-side polishing apparatus 100 includes a rotation mechanism for rotating the polishing head 120, and a movement mechanism for moving the polishing head 120 inside and outside the rotatable platen 140. In the single-side polishing apparatus 100, while holding the semiconductor wafer W, the polishing head 120 presses the polishing target surface of the semiconductor wafer W (i.e. the surface facing the platen 140) against the polishing cloth 130 attached to the upper surface of the rotatable platen 140. Both the polishing head 120 and the rotatable platen 140 are rotated to allow relative movement of the polishing head 120 and the rotatable platen 140, thereby performing chemical mechanical polishing on the polishing target surface of the semiconductor wafer W with a polishing liquid 160 being supplied from a polishing liquid supply means 150. For example, JP 2008-91594 A (PTL 1) discloses a single-side polishing apparatus of single wafer processing type for performing such single-side polishing.

CITATION LIST

Patent Literatures

PTL 1: JP 2008-91594 A

SUMMARY

Technical Problem

By single-side polishing, a flat surface having a certain level of high flatness can be formed, and surface roughness can be reduced. However, polishing unevenness in the semiconductor wafer surface is unavoidable, and it is difficult to form a completely flat surface on the nm order. The same applies to the case of subjecting a silicon wafer to single-side polishing. Accordingly, the quality of the silicon wafer surface after final polishing is evaluated using various indexes, and each silicon wafer satisfying predetermined conditions is treated as a conforming item.

In recent years, quality evaluation on silicon wafer surfaces after final polishing using the differential interference contrast (DIC) method has been increasingly employed. In detail, the number of concavo-convex-shape stepped minute defects with a height (or depth) exceeding a predetermined threshold is detected by the DIC method, and the quality of the silicon wafer surface is evaluated. The width of a stepped minute defect is typically about 30 µm to 100 µm, and the difference in level is very small.

In the DIC method, a laser L (e.g. He—Ne laser) is split by a beam splitter S and applied to the surface of the semiconductor wafer W, as illustrated in FIG. 2. A photodiode P receives light reflected off the surface of the semiconductor wafer W, via a mirror M. In the case where there is a concavo-convex-shape stepped minute defect D, a phase difference specific to a stepped minute defect is detected. The height information of the defect can be calculated from the optical path difference of reflected light. As used herein, a concavo-convex-shape stepped minute defect that has a height exceeding a threshold of 3.4 nm, which is regarded as particularly problematic, and that is detected by the DIC method is simply referred to as "stepped minute defect".

If the number of stepped minute defects is within a desired requirement, the quality of the silicon wafer surface after final polishing can be determined as good. Meanwhile any silicon wafer not satisfying the desired requirement is determined as a nonconforming item, and so cannot be shipped as a product.

With conventional single-side polishing methods, the stepped minute defect occurrence rate in the silicon wafer surface after final polishing is not necessarily at a satisfactory level. To improve the product yield, an improved single-side polishing method is needed.

It could therefore be helpful to provide a silicon wafer single-side polishing method that can significantly improve the stepped minute defect occurrence rate.

Solution to Problem

We conducted detailed research to solve the problem stated above, and conceived the following idea. First, when performing final polishing on a silicon wafer, the silicon wafer is in a naturally oxidized state. In detail, the silicon wafer is composed of a bare silicon (portion with no natural oxide film) and a silicon oxide film (which is typically a natural oxide film) coating the surface of the bare silicon. From this state, the single-side polishing of the silicon wafer is started. With single-side polishing methods, it is difficult to completely prevent polishing unevenness in the silicon wafer surface, and the moment at which a portion where the silicon oxide film is polishing-removed and a portion where the silicon oxide film remains coexist occurs (see Step 4B in FIG. 4 described later).

With single-side polishing methods, although the polishing removal of the silicon oxide film is performed by chemical mechanical polishing, the polishing removal of most of the silicon oxide film is contributed by mechanical polishing. Meanwhile, the polishing of the bare silicon is contributed by both chemical polishing and mechanical polishing. Hence, in the single-side polishing of the silicon wafer, the polishing rate of the silicon oxide is typically lower than the polishing rate of the silicon. After the occurrence of the above-mentioned coexistence state, while the polishing removal of the remaining silicon oxide film continues, the polishing of the bare silicon progresses rapidly in the portion where the silicon oxide film has already been polishing-removed. This portion will end up having a stepped minute defect.

We then contemplated performing single-side polishing with a condition of an increased silicon oxide polishing rate. In this case, however, since the contribution of mechanical polishing is dominant, not only the bare silicon polishing rate decreases, but also polishing sagging in the peripheral part of the silicon wafer is likely to increase. This is because a condition of an increased silicon oxide polishing rate is a polishing condition according to which the contribution of the mechanical polishing action is dominant, and therefore the contribution of the chemical polishing action decreases. We then discovered that the stepped minute defect occurrence rate can be significantly improved by first performing polishing intended for the polishing removal of the silicon oxide film and then performing polishing intended for the final polishing of the silicon. We thus provide the following.

A silicon wafer single-side polishing method according to the present disclosure is a silicon wafer single-side polishing method of holding, by a polishing head, a silicon wafer in which a silicon oxide film is formed on a bare silicon surface, and pressing the silicon wafer against a rotatable platen with a polishing cloth attached thereto while rotating the silicon wafer, to polish one side of the silicon wafer facing the rotatable platen, the silicon wafer single-side polishing method comprising: a first polishing step of performing polishing on the one side of the silicon wafer under a first polishing condition relating to an applied pressure for pressing the silicon wafer and a relative speed of the silicon wafer and the rotatable platen; and a second polishing step of performing polishing on the one side of the silicon wafer under a second polishing condition in which at least one of the applied pressure and the relative speed in the first polishing condition is changed, after the first polishing step, wherein a polishing rate ratio of a silicon oxide polishing rate to a silicon polishing rate according to the first polishing condition is higher than a polishing rate ratio of a silicon oxide polishing rate to a silicon polishing rate according to the second polishing condition.

Preferably, the first polishing step is performed until at least the silicon oxide film is removed.

Preferably, the polishing rate ratio according to the first polishing condition is 0.5 or more. Preferably, the polishing rate ratio according to the second polishing condition is less than 0.5.

Advantageous Effect

According to the present disclosure, the first polishing step and the second polishing step are performed under the respective polishing conditions that differ in the polishing rate ratio of the silicon oxide polishing rate to the silicon polishing rate. It is thus possible to provide a silicon wafer single-side polishing method that can significantly improve the stepped minute defect occurrence rate.

DETAILED DESCRIPTION

Figure 3:
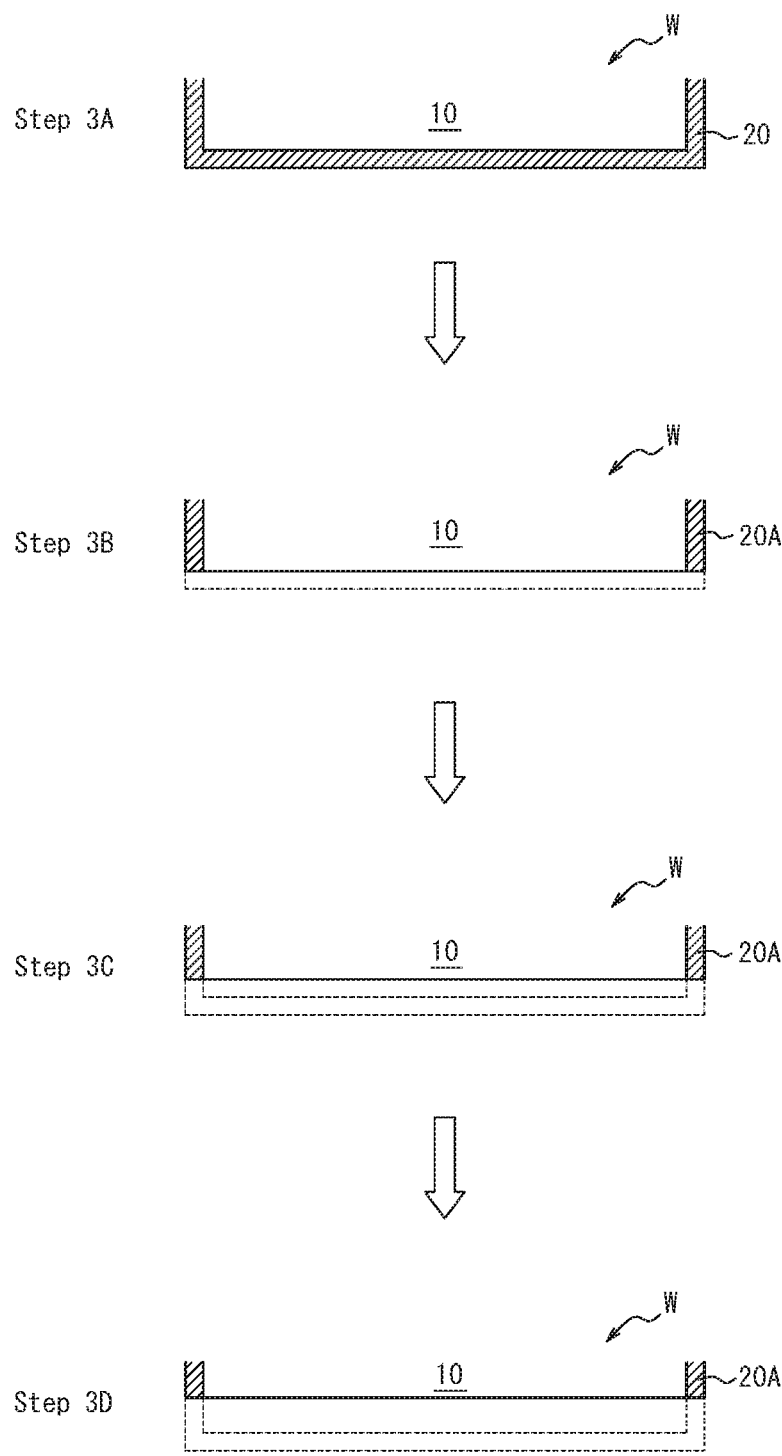
FIG. 3 is a schematic sectional diagram illustrating a polishing process by a single-side polishing method according to one of the disclosed embodiments.
Figure 4:
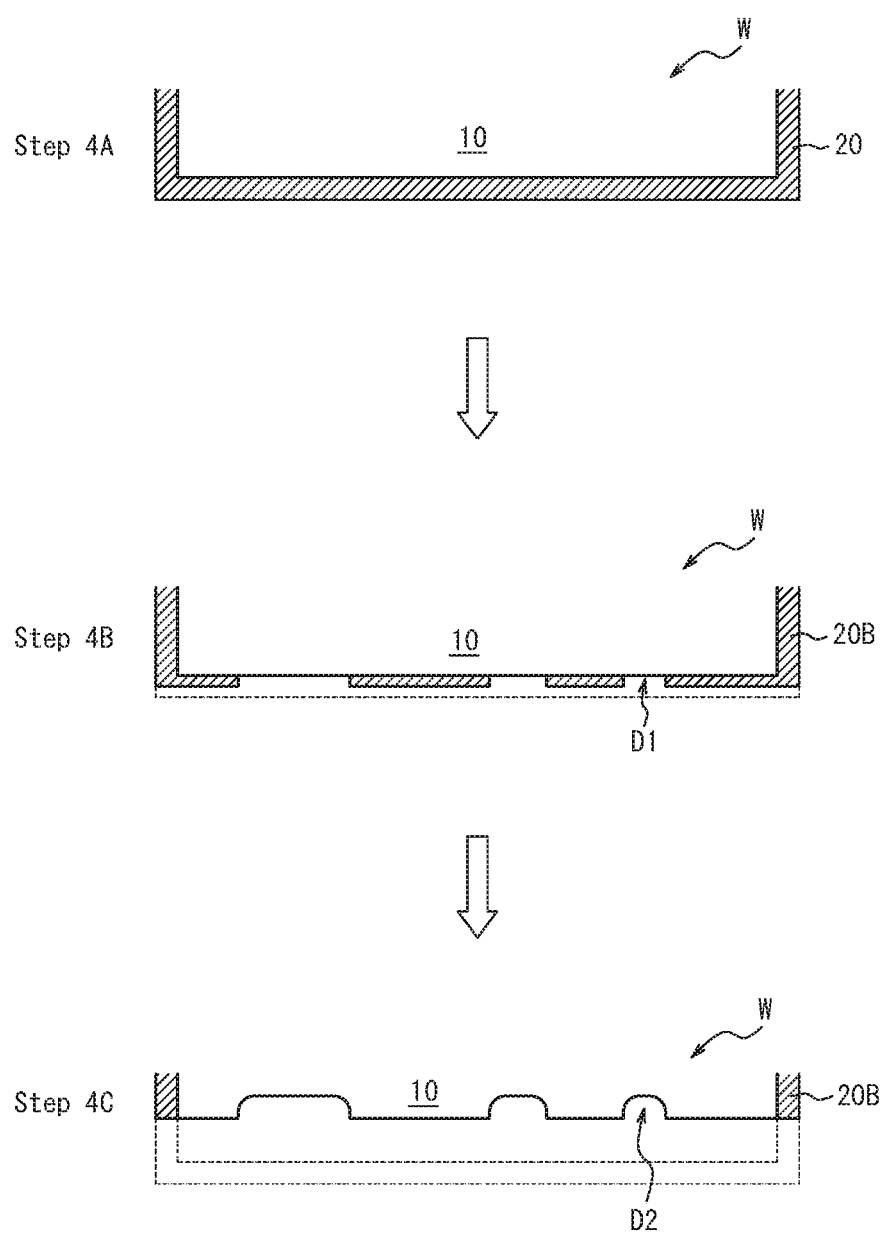
FIG. 4 is a schematic sectional diagram illustrating a polishing process by a conventional single-side polishing method.

One of the disclosed embodiments is described below, with reference to drawings. In FIGS. 3 and 4, the aspect ratios of the silicon wafer and the silicon oxide film are exaggerated and differ from the actual ratios, for convenience of illustration.

(Single-Side Polishing Method)

Figure 1:
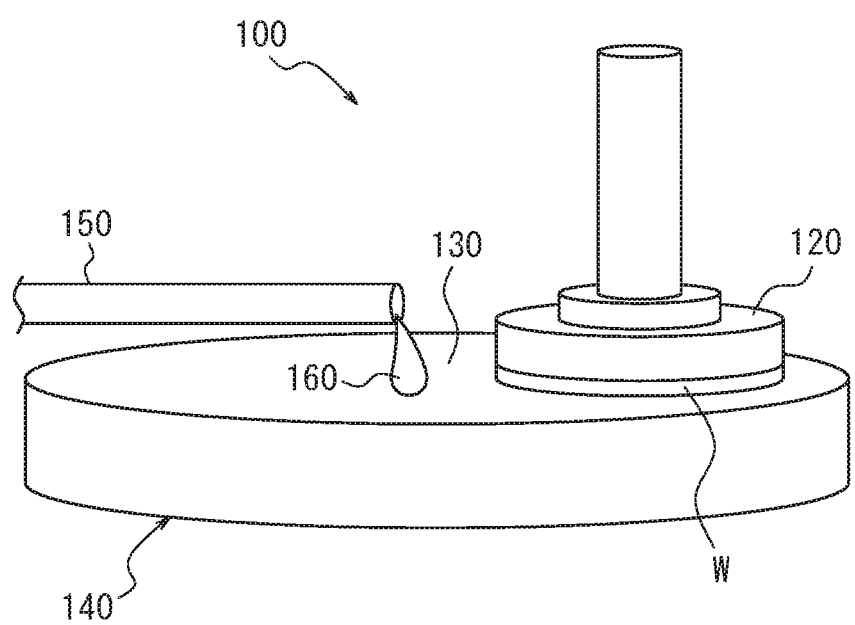
FIG. 1 is a schematic diagram illustrating a conventional semiconductor wafer single-side polishing method.
Figure 2:
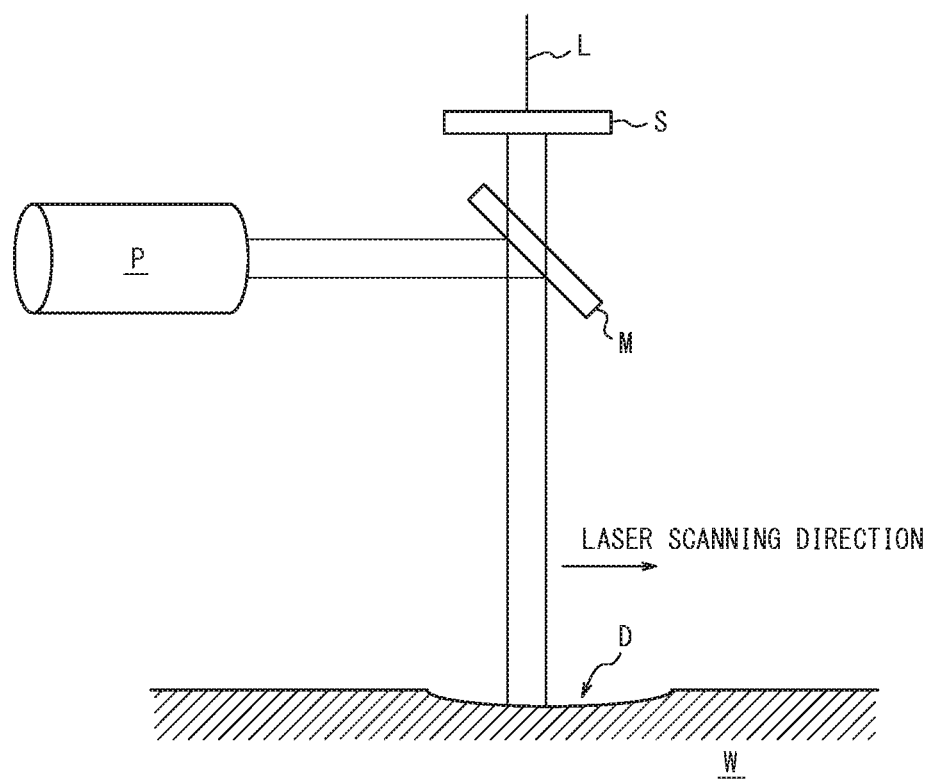
FIG. 2 is a schematic diagram illustrating the stepped minute defect measurement principle by the differential interference contrast method according to a conventional technique.

A silicon wafer single-side polishing method according to one of the disclosed embodiments is described below, with reference to FIGS. 1 and 3. In this embodiment, a silicon wafer W in which a silicon oxide film 20 is formed on a surface of a bare silicon 10 is held by a polishing head and, while rotating the silicon wafer W, the silicon wafer W is pressed against a rotatable platen to which a polishing cloth is attached, to polish one side of the silicon wafer W facing the rotatable platen.

This single-side polishing can be performed according to a usual method using a typical single-side polishing apparatus. With reference to the above-mentioned FIG. 1, while holding the silicon wafer W, the polishing head 120 presses the polishing target surface of the silicon wafer W (i.e. the surface facing the rotatable platen 140) against the polishing cloth 130 attached to the upper surface of the rotatable platen 140. Both the polishing head 120 and the rotatable platen 140 are rotated to allow relative movement of the polishing head 120 and the rotatable platen 140, thereby performing chemical mechanical polishing only on the polishing target surface of the silicon wafer W with the polishing liquid 160 being supplied from the polishing liquid supply means 150. Single-side polishing can thus be performed. In the single-side polishing, only the polishing head 120 may be rotated, or only the rotatable platen 140 may be rotated. The polishing head 120 and the rotatable platen 140 may be rotated in the same direction, or rotated in opposite directions. Although FIG. 1 illustrates single-side polishing of single wafer processing type that polishes only a single silicon wafer W, single-side polishing of batch type that subjects a plurality of wafers simultaneously to single-side polishing may be used.

The single-side polishing method according to this embodiment includes: a first polishing step of performing polishing on the one side of the silicon wafer W under a first polishing condition relating to the applied pressure for pressing the silicon wafer W and the relative speed of the silicon wafer W and the rotatable platen (Step 3A and Step 3B of FIG. 3): and a second polishing step of performing polishing on the one side of the silicon wafer W under a second polishing condition in which at least one of the applied pressure and the relative speed in the first polishing condition is changed, after the first polishing step (Step 3C and Step 3D of FIG. 3). The reason why the first and second polishing conditions relate to the applied pressure and the relative speed is that the applied pressure and the relative speed particularly influence each of the silicon polishing rate (hereafter referred to as "Si polishing rate") and the silicon oxide polishing rate (hereafter referred to as "SiO$_2$ polishing rate"). Here, the expression "SiO$_2$" is not intended to specify the composition ratio of a stoichiometric composition, but represents silicon oxide that can be formed on a silicon surface by typical natural oxidation, for convenience's sake. The same applies hereafter.

It is important in this embodiment that the polishing rate ratio (hereafter referred to as "SiO$_2$/Si polishing rate ratio") of the SiO$_2$ polishing rate to the Si polishing rate according to the first polishing condition is higher than the SiO$_2$/Si polishing rate ratio according to the subsequent second polishing condition. Through these steps, the stepped minute defect occurrence rate in the silicon wafer surface after polishing can be significantly improved. Each step is described below.

In the first polishing step (Step 3A and Step 3B of FIG. 3), the one side of the silicon wafer W is polished. The polishing condition relating to the applied pressure for pressing the silicon wafer W and the relative speed of the silicon wafer W and the rotatable platen when polishing the silicon wafer W in the first polishing step is referred to as the first polishing condition. The first polishing step involves polishing primarily intended for the polishing removal of the silicon oxide film 20. The first polishing condition will be described in detail later, together with the second polishing condition. In the example of the single-side polishing apparatus 100 in FIG. 1, the relative speed is determined by the rotational speed of the rotatable platen 140 and the rotational speed of the silicon wafer W by the polishing head 120. When the rotational frequency of at least one of the rotatable platen 140 and the polishing head 120 is changed, the relative speed changes. In a single-side polishing apparatus of batch type, too, the relative speed is determined by the rotational speeds of the polishing head and the rotatable platen.

The first polishing condition may include not only the above-mentioned applied pressure and relative speed but also the slurry type (particle diameter, concentration, pH, etc.) and supply temperature, the material, pore diameter, and aperture ratio, etc. of the polishing cloth, and the like. The second polishing condition may include not only the applied pressure and the relative speed but also the slurry type and supply temperature, the material, pore diameter, and aperture ratio of the polishing cloth, and the like as polishing conditions, as with the first polishing condition.

In the second polishing step (Step 3C and Step 3D of FIG. 3), the one side of the silicon wafer W is polished, following the first polishing step. The second polishing step involves polishing primarily intended for the polishing of the bare silicon 10 after the silicon oxide film 20 has already been removed. Here, the SiO$_2$/Si polishing rate ratio according to the first polishing condition is higher than the SiO$_2$/Si polishing rate ratio according to the second polishing condition, as mentioned above. In other words, the SiO$_2$/Si polishing rate ratio according to the second polishing condition is lower than the SiO$_2$/Si polishing rate ratio according to the first polishing condition.

The technical meaning of setting the SiO$_2$/Si polishing rate ratio according to the first polishing condition higher than the SiO$_2$/Si polishing rate ratio according to the second polishing condition in this embodiment as mentioned above is described below, with reference to FIGS. 3 to 6. As illustrated in Step 3A to Step 3D of FIG. 3, in this embodiment, after polishing the silicon oxide film 20 in the first polishing step, the bare silicon 10 is polished in the second polishing step, so that the stepped minute defect occurrence rate can be significantly improved. This operation and effect can be more clearly understood in comparison with a conventional single-side polishing method illustrated in Step 4A to Step 4C in FIG. 4, as described below.

In the conventional single-side polishing method, single-side polishing is performed on the silicon wafer W without changing the SiO$_2$/Si polishing rate ratio. Step 4A to Step 4C of FIG. 4 schematically illustrate this polishing process. The conventional technique focuses primarily on polishing the bare silicon 10, without taking the occurrence of stepped minute defects into consideration. Hence, single-side polishing is performed with a constant SiO$_2$/Si polishing rate ratio. In the polishing condition of the conventional technique, the SiO$_2$/Si polishing rate ratio is typically set to be relatively low. In the conventional technique, if a state in which the silicon oxide film 20B and the bare silicon 10 coexist in the polishing-side surface as illustrated in Step 4B of FIG. 4 occurs, in the subsequent polishing, while the remaining silicon oxide film 20B is polishing-removed, the polishing of the bare silicon 10 progresses rapidly in a portion D1 where the silicon oxide film 20B has already been polishing-removed. This portion will end up having a stepped minute defect D2. Such a stepped minute defect D2 is detectable by the DIC method using a commercially available wafer surface inspection apparatus.

Figure 5A:
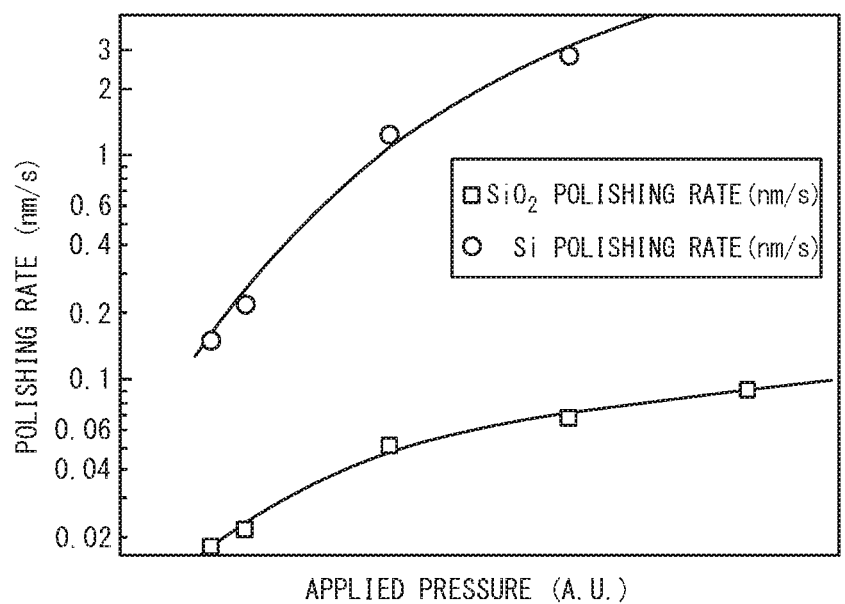
FIG. 5A is a graph illustrating an example of the respective polishing rates of silicon and silicon oxide against the applied pressure according to one of the disclosed embodiments.

FIG. 5A gives an example of a graph illustrating the polishing rate against the applied pressure in the case where only the applied pressure is changed in a predetermined single-side polishing apparatus. Here, the polishing conditions such as the relative speed of the silicon wafer and the rotatable platen other than the applied pressure are the same. The horizontal axis is set as an arbitrary unit (A.U.). There is a tendency that the SiO$_2$ polishing rate and the Si polishing rate are both lower when the applied pressure is lower, and the SiO$_2$ polishing rate and the Si polishing rate are both higher when the applied pressure is higher. The respective change rates of the SiO$_2$ polishing rate and the Si polishing rate are different from each other, and the two polishing rates are closer to each other when the applied pressure is lower. There is thus a tendency that the SiO$_2$/Si polishing rate ratio is higher when the applied pressure is lower, as can be understood from FIG. 5A. This is considered to be because the contribution of the chemical polishing action is lower when the applied pressure is lower.

Figure 5B:
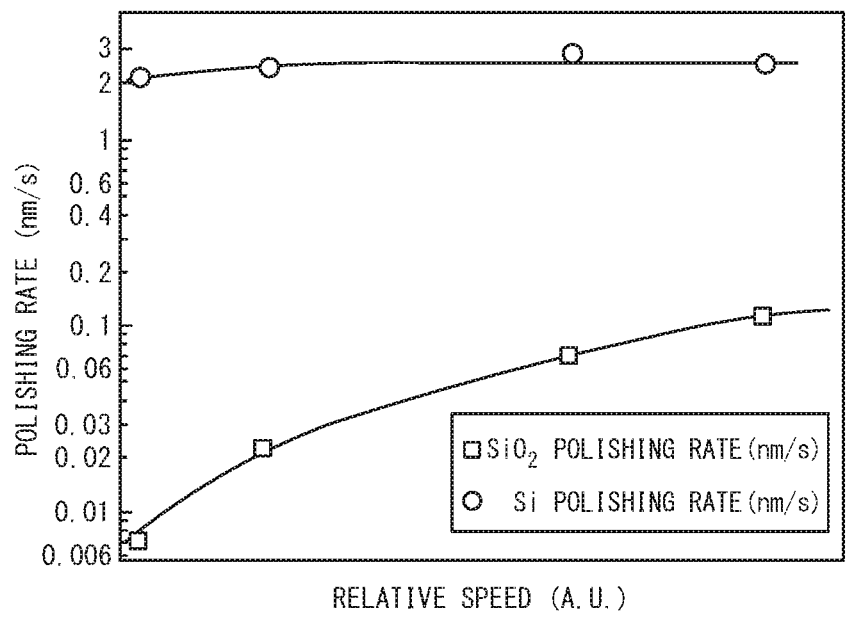
FIG. 5B is a graph illustrating an example of the respective polishing rates of silicon and silicon oxide against the relative speed according to one of the disclosed embodiments.

FIG. 5B gives an example of a graph illustrating the polishing rate against the relative speed of the silicon wafer and the rotatable platen in the case where only the relative speed is changed in the above-mentioned single-side polishing apparatus. Here, the polishing conditions such as the applied pressure other than the relative speed are the same. The horizontal axis is set as an arbitrary unit (A.U.), as in FIG. 5A. The SiO$_2$ polishing rate and the Si polishing rate are both lower when the relative speed is lower, and the SiO$_2$ polishing rate and the Si polishing rate are both higher when the relative speed is higher. The respective change rates of the SiO$_2$ polishing rate and the Si polishing rate are different from each other, as in FIG. 5A. The two polishing rates are closer to each other when the relative speed is higher, so that the SiO$_2$/Si polishing rate ratio is higher when the relative speed is higher. This is considered to be because the contribution of the mechanical polishing action is lower when the relative speed is lower.

Figure 6:
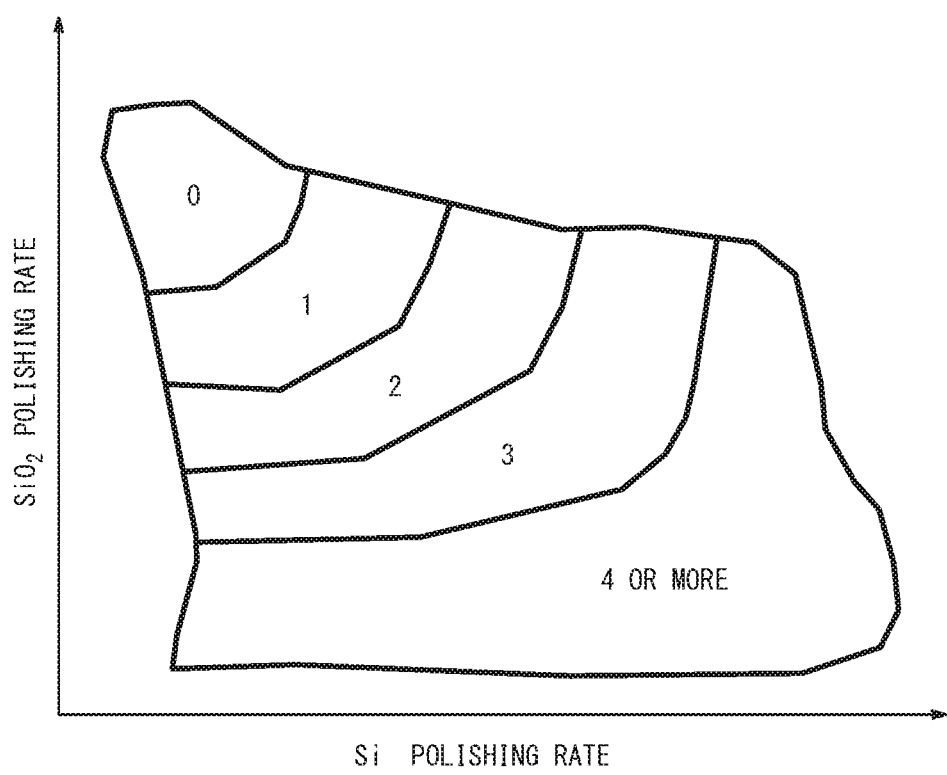
FIG. 6 is a graph illustrating the number of stepped minute defects with the silicon polishing rate and the silicon oxide polishing rate according to one of the disclosed embodiments.

Thus, under a predetermined polishing condition, the SiO$_2$ polishing rate and the Si polishing rate are each uniquely determined, and the $SiO_2$/Si polishing rate ratio is uniquely determined. The relationship between the stepped minute defect occurrence rate (number rate) and the first polishing condition is described below, using a graph in FIG. 6. The numerical value in each region in FIG. 6 indicates the number of stepped minute defects that occur with a probability of a predetermined threshold (e.g. 90%). In the drawing, "0" indicates that no stepped minute defect occurs with the probability of the predetermined threshold. As illustrated in FIG. 6, when the Si polishing rate is higher and when the $SiO_2$ polishing rate is lower, the stepped minute defect occurrence rate is higher. Although each of the $SiO_2$ polishing rate and the Si polishing rate may vary widely depending on not only the applied pressure and the relative speed but also the specifications of the single-side polishing apparatus, the material of the polishing pad, the silicon wafer type, etc., the stepped minute defect occurrence rate is considered to be greatly dependent on the $SiO_2$/Si polishing rate ratio. Accordingly, we focused attention on the $SiO_2$/Si polishing rate ratio, conceived setting the $SiO_2$/Si polishing rate ratio according to the first polishing condition higher than the $SiO_2$/Si polishing rate ratio according to the second polishing condition, and experimentally confirmed its effect.

As described above, in this embodiment, the $SiO_2$/Si polishing rate ratio according to the first polishing condition is higher than the $SiO_2$/Si polishing rate ratio according to the second polishing condition. Under such conditions, polishing intended for the polishing removal of the silicon oxide film 20 is performed in the first polishing step (Step 3A to Step 3B of FIG. 3), and then the polishing of the bare silicon 10 after the silicon oxide film 20 has already been removed is performed in the second polishing step (Step 3C to Step 3D of FIG. 3). Consequently, the stepped minute defect occurrence rate can be significantly improved as compared with the conventional technique.

In view of this technical meaning, the first polishing step is preferably performed until at least the silicon oxide film 20 is removed. The removal of the silicon oxide film 20 mentioned here denotes the removal of the portion of the silicon oxide film 20 covering the main surface of the bare silicon 10 as illustrated in Step 3A to Step 3B of FIG. 3. It is not necessarily to remove the silicon oxide film 20A at the lateral sides of the bare silicon 10.

For example, the first polishing step may be performed until the silicon oxide film 20 is removed, in the following manner. A silicon wafer of the same type as the silicon wafer W is prepared beforehand and the time until the silicon oxide film is completely removed is measured, and the first polishing step is performed for the time (or for a sum of the time and a predetermined time). Alternatively, the removal of the silicon oxide film may be detected using, for example, a torque of a motor for driving the rotatable platen or the polishing head in the single-side polishing apparatus, after which the second step is performed. In this embodiment, even by merely setting a desired time for the first polishing step as appropriate, the stepped minute defect occurrence rate can be significantly improved as compared with the conventional technique.

The $SiO_2$/Si polishing rate ratio according to the first polishing condition is preferably 0.5 or more. The $SiO_2$/Si polishing rate ratio may be still higher. In this case, the number of stepped minute defects can be reduced remarkably. No upper limit is placed on the $SiO_2$/Si polishing rate ratio.

The $SiO_2$/Si polishing rate ratio according to the second polishing condition is preferably less than 0.5. The $SiO_2$/Si polishing rate ratio may be set as appropriate in this range, in view of the flatness and shape of the silicon wafer.

The present disclosure is applicable to any silicon wafer whose bulk silicon substrate surface is naturally oxidized to form a silicon oxide film. The size and thickness of the silicon wafer are not limited.

A single-side polishing interruption step of changing the polishing condition may be provided between the first polishing step and the second polishing step in this embodiment. A polishing condition adjustment step of proceeding with single-side polishing while gradually changing the polishing condition may be included in this embodiment.

After the single-side polishing ends, a cleaning step using pure water or the like may be performed.

The single-side polishing method according to this embodiment is particularly suitable for final polishing in which single-side polishing is performed using a relatively soft polishing cloth such as suede material.

As used herein, the term "the same" or "the same type" does not imply strict mathematical equality, and may naturally involve errors tolerated as long as the operation and effect of the disclosed features can be achieved, including unavoidable errors caused in a process of producing a silicon wafer. For example, an error of approximately 1% is tolerated in the present disclosure.

EXAMPLES

More detailed description is given below using examples, although the present disclosure is not limited to these examples.

Preliminary Experiment Example

Figure 7:
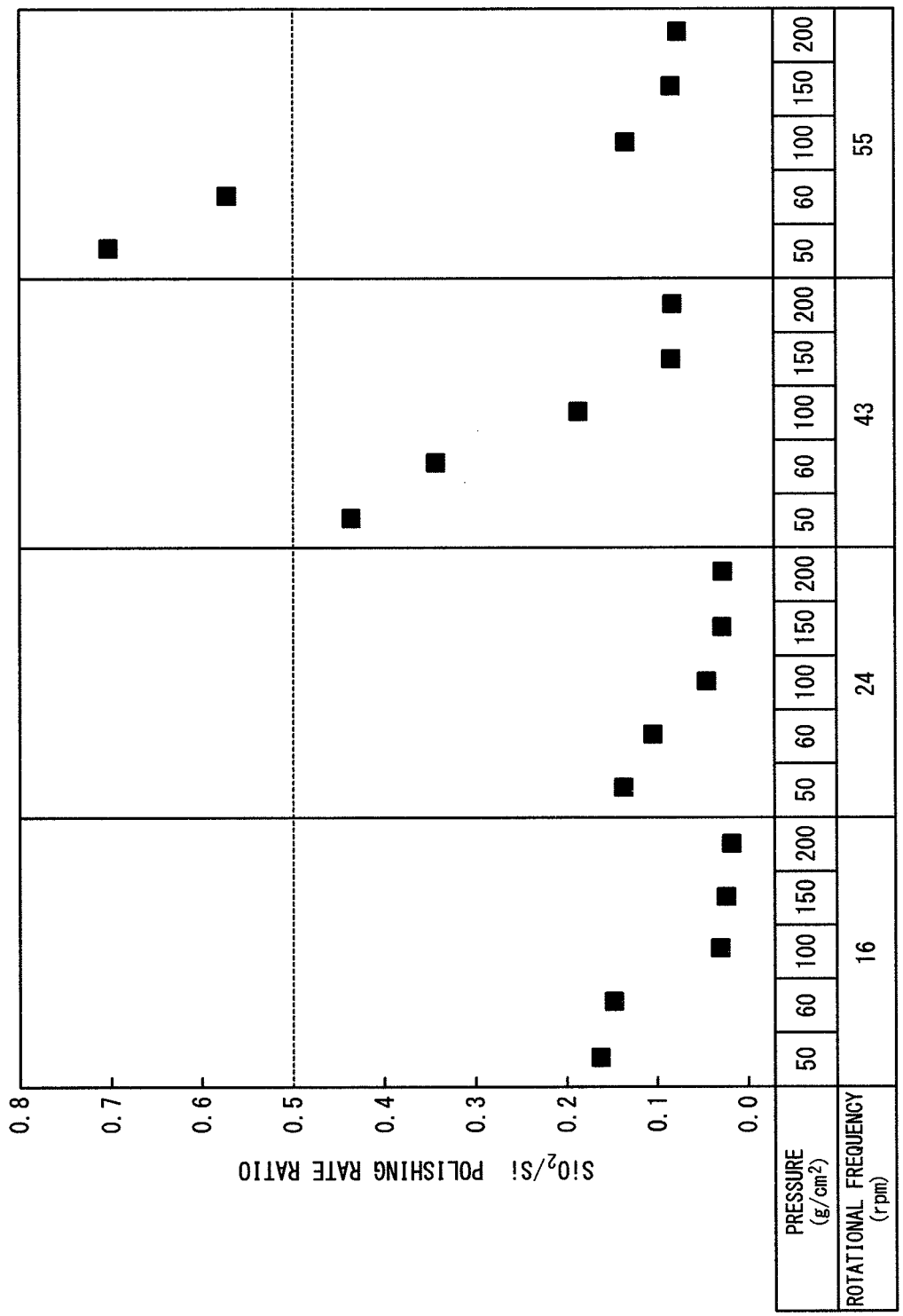
FIG. 7 is a graph illustrating the polishing rate ratio measured in a preliminary experiment example.

A plurality of silicon wafers of the same type having a diameter of 300 mm and a total thickness of 775 μm (natural oxide film thickness: 1 nm) were prepared. A polishing cloth made of suede material was placed on a surface of a platen and, while supplying an alkali polishing liquid as polishing slurry, final polishing by chemical mechanical polishing was performed using a single-side polishing apparatus of batch type. The polishing head and the rotatable platen had the same rotational frequency, and were rotated in the same direction. Only the applied pressure (g/cm$^2$) when pressing the silicon wafer against the rotatable platen and the rotational frequency (rpm) of the polishing head and the rotatable platen were changed according to the following conditions. In detail, in the single-side polishing apparatus 100, the rotational frequency (rpm) of the polishing head and the rotatable platen was 16, 24, 43, and 55. At each rotational frequency, the applied pressure (g/cm$^2$) was changed in a range of 50, 60, 100, 150, and 200. From a machining allowance of polishing, each of the $SiO_2$ polishing rate and the Si polishing rate (nm/s) was calculated. The $SiO_2$/Si polishing rate ratio was then determined from the calculated $SiO_2$ polishing rate and Si polishing rate. The results are listed in FIG. 7.

Example 1

Each silicon wafer of the same type as the silicon wafers used in the preliminary experiment example was subjected to the first polishing step and the second polishing step under the polishing conditions listed in the following Table 1. Further, after the second polishing step, a step of cleaning the polished silicon wafer using pure water was performed. 100 silicon wafers were thus subjected to single-side polishing, with the other conditions being the same as those in the preliminary experiment example. In Table 1, the $SiO_2/Si$ polishing rate ratio is simply referred to as "polishing rate ratio". Since the $SiO_2$ polishing rate in the first polishing step was 1 nm/min, it can be regarded that the whole silicon oxide film was removed by polishing for 60 sec. Although the $SiO_2/Si$ polishing rate ratio was different between the first polishing step and the second polishing step, the first polishing step involved low-pressure and high-speed rotation whereas the second polishing step involved high-pressure and low-speed rotation, so that the $SiO_2$ polishing rate was approximately the same in the two polishing steps.

TABLE 1

| Step | Example 1 | Conventional Example 1 |
| --- | --- | --- |
| First polishing step | Applied pressure: 60 g/cm² Rotational speed: 55 rpm Polishing time: 60 sec Polishing rate ratio: 0.5 | Applied pressure: 180 g/cm² Rotational speed: 20 rpm Polishing time: 210 sec Polishing rate ratio: 0.05 |
| Second polishing step | Applied pressure: 180 g/cm² Rotational speed: 20 rpm Polishing time: 150 sec Polishing rate ratio: 0.05 | |

Conventional Example 1

100 silicon wafers were subjected to single-side polishing in the same way as Example 1, except that the first polishing step in Example 1 was not performed and the polishing conditions in Table 1 were used.

Example 2

100 silicon wafers were subjected to single-side polishing in the same way as Example 1, except that the rotational speed in the first polishing step in Example 1 was changed so that the $SiO_2/Si$ polishing rate ratio was 0.3.

Example 3

100 silicon wafers were subjected to single-side polishing in the same way as Example 1, except that the rotational speed in the first polishing step in Example 1 was changed so that the $SiO_2/Si$ polishing rate ratio was 0.1.

Evaluation

The surface of each silicon wafer according to each of Example 1 and Conventional Example 1 after polishing was measured by the DIC mode (measurement mode by the DIC method), using a wafer surface inspection apparatus (Surfscan SP2 produced by KLA-Tencor). In the measurement, the threshold of the height of concavo-convex-shape stepped minute defects was set to 3.4 nm, and the number of stepped minute defects exceeding this threshold was obtained. The number of silicon wafers in each of which the number of defects detected by the DIC method was 0 was determined in each of Example 1 and Conventional Example 1. In Example 1, no stepped minute defect was found in 93 silicon wafers out of 100 silicon wafers. In Conventional Example 1, no stepped minute defect was found in 61 silicon wafers out of 100 silicon wafers. Thus, the stepped defect occurrence rate was 7% in Example 1, and 39% in Conventional Example 1. For each of Examples 2 and 3, the number of silicon wafers in each of which the number of defects was 0 was determined in the same way as Example 1, and the stepped defect occurrence rate was calculated. The results are listed in the following Table 2. Although single-side polishing was performed at a constant $SiO_2/Si$ polishing rate ratio in Conventional Example 1 without distinguishing the first polishing step and the second polishing step from each other, the polishing rate ratio is indicated as the polishing rate ratio in the first polishing step in Table 2.

TABLE 2

| | Polishing rate ratio in first polishing step | Occurrence rate |
| --- | --- | --- |
| Example 1 | 0.5 | 7% |
| Example 2 | 0.3 | 12% |
| Example 3 | 0.1 | 30% |
| Conventional Example 1 | 0.05 | 39% |

These results demonstrate that, by performing the first polishing step with a higher $SiO_2/Si$ polishing rate ratio than the $SiO_2/Si$ polishing rate ratio in the subsequent second polishing step, the stepped defect occurrence rate was significantly improved as compared with the conventional technique. The improving effect was particularly remarkable in Example 1 where the $SiO_2/Si$ polishing rate ratio in the first polishing step was 0.5.

INDUSTRIAL APPLICABILITY

It is therefore possible to provide a silicon wafer single-side polishing method that can significantly improve the stepped minute defect occurrence rate.

REFERENCE SIGNS LIST 10 bare silicon
20 silicon oxide film
100 single-side polishing apparatus
120 polishing head
130 polishing cloth
140 rotatable platen
W semiconductor wafer (silicon wafer)

The invention claimed is:

1. A silicon wafer single-side polishing method of holding, by a polishing head, a silicon wafer in which a silicon oxide film is formed on a bare silicon surface, and pressing the silicon wafer against a rotatable platen with a polishing cloth attached thereto while rotating the silicon wafer, to polish one side of the silicon water facing the rotatable platen, the silicon wafer single-side polishing method comprising a first polishing step of performing polishing on the one side of the silicon wafer under a first polishing condition relating to an applied pressure for pressing the silicon wafer and a relative speed of the silicon wafer and the rotatable platen; and
a second polishing step of performing polishing on the one side of the silicon wafer under a second polishing condition in which at least one of the applied pressure and the relative speed in the first polishing condition is changed, after the first polishing step,
wherein a polishing rate ratio of a silicon oxide polishing rate to a silicon polishing rate according to the first polishing condition is higher than a polishing rate ratio of a silicon oxide polishing rate to a silicon polishing rate according to the second polishing condition.

2. The silicon wafer single-side polishing method according to claim 1, wherein the first polishing step is performed until at least the silicon oxide film is removed from the one side of the silicon wafer facing the rotatable platen.

3. The silicon wafer single-side polishing method according to claim 1, wherein the polishing rate ratio according to the first polishing condition is 0.5 or more.

4. The silicon water single-side polishing method according to claim 1, wherein the polishing rate ratio according to the second polishing condition is less than 0.5.

\* \* \* \* \*

UNITED STATES PATENT AND TRADEMARK OFFICE
CERTIFICATE OF CORRECTION

PATENT NO. : 11,628,534 B2  
APPLICATION NO. : 16/069300  
DATED : April 18, 2023  
INVENTOR(S) : T. Nakajima et al.

Page 1 of 1

It is certified that error appears in the above-identified patent and that said Letters Patent is hereby corrected as shown below:

In the Claims

Column 10, Lines 50-51 (Claim 1, Lines 7-8) please change "comprising a" to -- comprising: a --  
Column 11, Line 6 (Claim 4, Line 1) please change "silicon water" to -- silicon wafer --

Signed and Sealed this  
Fifteenth Day of August, 2023

Katherine Kelly Vidal  
*Director of the United States Patent and Trademark Office*